United States Patent
Chen

(10) Patent No.: US 7,116,727 B2
(45) Date of Patent: Oct. 3, 2006

(54) FREQUENCY OFFSET ESTIMATION APPARATUS FOR INTERSYMBOL INTERFERENCE CHANNELS

(75) Inventor: Hung-Kun Chen, Hsinchu (TW)

(73) Assignee: Mediatek Inc., Hsinchu (TW)

( * ) Notice: Subject to any disclaimer, the term of this patent is extended or adjusted under 35 U.S.C. 154(b) by 764 days.

(21) Appl. No.: 10/353,358

(22) Filed: Jan. 29, 2003

(65) Prior Publication Data

US 2003/0142761 A1 Jul. 31, 2003

Related U.S. Application Data

(63) Continuation-in-part of application No. 10/062,116, filed on Jan. 30, 2002, now Pat. No. 6,990,156.

(51) Int. Cl.
*H04L 27/14* (2006.01)

(52) U.S. Cl. ..................................... 375/316

(58) Field of Classification Search ............... 375/136, 375/143, 147, 152, 153, 269, 279, 280, 300, 375/316, 322, 323, 334, 335, 336, 338, 343, 375/344, 345, 350, 375; 341/50, 111, 116, 341/126; 455/130, 226.1; 708/100, 200, 708/445

See application file for complete search history.

(56) References Cited

U.S. PATENT DOCUMENTS 6,567,480 B1* 5/2003 Brardjanian et al. ........ 375/331

6,996,156 B1* 2/2006 Ono ........................... 375/147
2003/0058966 A1* 3/2003 Gilbert et al. ............... 375/326
2003/0147456 A1* 8/2003 Kumura ...................... 375/148

OTHER PUBLICATIONS

"Simultaneous Clock Phase and Frequency Offset Estimation" K. E. Scott, et al.; IEEE Transactions on Communications; Jul. 1995.
"Fast Frame Synchronization, Frequency Offset Estimation and Channel Acquisition for Spontaneous Transmission Over Unknown Frequency-Selective Radio Channels" S.A. Fechtel, et al.; 1993.
"A Frequency Offset Estimation Technique for Wireless Channels" A. R. S. Bahai, et al.; 1997.
"A Frequency Offset Estimation Technique for Frequency-Selective Fading Channels" H. Viswanathan, et al.; Apr. 2001.

* cited by examiner

*Primary Examiner*—Khanh Cong Tran
*Assistant Examiner*—Sam K. Ahn
(74) *Attorney, Agent, or Firm*—Thomas, Kayden, Horstemeyer & Risley

(57) ABSTRACT

A frequency offset estimation apparatus for intersymbol interference channels. A storage area having M elements is provided to shift a received sample sequence by M samples to generate a lagged sample sequence. A sequence of preliminary values is calculated by differential operation between the received sample sequence and the lagged sample sequence. Next, a summation of the power of the preliminary value sequence over M' samples is taken to obtain an accumulative sum. Finally, the angle of the accumulative sum is derived and then scaled by a factor. A frequency offset estimate for the received sample sequence is thus obtained.

20 Claims, 5 Drawing Sheets

FREQUENCY OFFSET ESTIMATION APPARATUS FOR INTERSYMBOL INTERFERENCE CHANNELS

CROSS-REFERENCE TO RELATED APPLICATION

This application is a continuation-in-part of application Ser. No. 10/062,116, filed Jan. 30, 2002 now U.S. Pat. No. 6,990,156.

BACKGROUND OF THE INVENTION

1. Field of the Invention

The invention relates to communication systems, and more particularly to a frequency offset estimation scheme for intersymbol interference channels.

2. Description of the Related Art

Communication channels, and in particular, wireless communication channels, are subject to channel impairments such as multipath propagation in addition to additive noise. In the case of carrier modulation systems, carrier frequency offset that typically occurs due to transmitter and receiver oscillator mismatch in such systems is further compounded by Doppler shifts in mobile RF communications. Rapid frequency acquisition and phase tracking are crucial for accurate decoding of the received information. In general, a large frequency offset gives rise to rapid phase rotation which may be far beyond the tracking capability of a receiver, and of course, seriously degrades the performance of the system. Therefore, estimation and compensation of frequency offset are performance-critical tasks before demodulation at the receiver.

Several known estimation algorithms of frequency offset have been developed on the basis of an ideal channel condition of additive white Gaussian noise (AWGN). In some applications, e.g. a multipath environment, distortion of received signals may introduce considerable intersymbol interference (ISI). The problem of ISI is particularly troublesome in wireless communications. This phenomenon leads to extra noise and degrades the performance of frequency offset estimation.

The presence of ISI thus has to be addressed when designing a scheme to estimate the frequency offset. Scott et al. present a frequency offset estimation algorithm based on applying a nonlinear operation on the received signal, see "Simultaneous Clock Phase and Frequency Offset Estimation," *IEEE Trans. on Commun.*, Vol. 43, pp. 2263–2270, July 1995. This scheme requires the Fourier transform computations and some approximation based on assumption of the channel impulse response. Conversely, Fechtel et al. disclose algorithms for entirely feedforward joint frame synchronization, frequency offset estimation and channel acquisition, see "Fast Frame Synchronization, Frequency Offset Estimation and Channel Acquisition for Spontaneous Transmission over Unknown Frequency-Selective Radio Channels," *Proc. IEEE PIMRC*, pp. 229–233, September 1993. Based on the maximum-likelihood (ML) criterion, Fechtel's method scans data segments of received samples to fulfill the frequency offset estimation. In this scheme, knowledge of the received symbol and symbol timing is required. Bahai et al. reveal that the frequency offset can be estimated by the phase rotation of the channel coefficients, see "A Frequency Offset Estimation Technique for Wireless channels," in 1997 *IEEE Workshop on Signal Processing Advances in Wireless Communications*, Paris, April 1997, pp. 397–400. Bahai's algorithm still depends on the transmission of a known symbol pattern. Additionally, Viswanathan et al. propose a method called maximum state-based accumulation (MSA) estimation, refer to "A Frequency Offset Estimation Technique for Frequency-Selective Fading Channels," *IEEE Commun. Letters*, Vol. 5, pp. 166–168, April 2001. This technique relies on knowledge of the modulated data in the received signal.

In view of the above, the prior known estimation techniques for ISI channels, however, either have the disadvantage of high computational complexity, or are difficult to implement in integrated circuits.

SUMMARY OF THE INVENTION

It is an object of the present invention to provide an apparatus of frequency offset estimation for ISI channels, which is suitable for integrated circuit implementation.

It is another object of the present invention to provide a frequency offset estimation scheme for ISI channels without knowledge of the received symbol and symbol timing.

The present invention is generally directed to a frequency offset estimation apparatus for intersymbol interference channels. According to one aspect of the invention, the apparatus includes a storage area, a differential unit, a power operator, an accumulator, an argument extractor and a scale unit. The storage area contains M elements to take a received sample sequence serially. Using these M elements, the received sample sequence is shifted by M samples to form a lagged sample sequence. The differential unit is provided to perform a differential operation between the received and the lagged sample sequences to obtain a sequence of preliminary values. The power operator receives the sequence of preliminary values and calculates a pth power of each preliminary value, where p denotes the power to raise preliminary values. The accumulator then receives the power of the preliminary value sequence from the power operator. Taking a summation of the power of the preliminary value sequence over M' samples with respect to the received sample sequence, the accumulator yields an accumulative sum that is a complex number. The argument extractor is adapted to obtain the angle of the accumulative sum. Then, the scale unit scales the angle of the accumulative sum by a factor of $1/p$, thereby estimating a frequency offset for the received sample sequence.

According to another aspect of the invention, an apparatus for estimation of frequency offset is comprised of a state indicator, a state bank, a differential unit, a plurality of computation units and a weighting calculator. The state indicator receives a sequence of data symbols to generate a state signal indicative of a symbol state defined by a current data symbol and L most recently received data symbols, where L is the length of channel delay spread. The state bank includes a first input to take a received sample sequence, a second input to receive a current index associated with the current data symbol and a third input to receive the state signal. In accordance with the state signal, the state bank is configured in which to store the current index from the second input and M currently received samples of the current data symbol from the first input, and to retrieve M previously received samples of the same symbol state and an associated previous index, where M is a positive integer. The differential unit performs a differential operation between the M currently received samples in the received sample sequence and the M previously received samples of the same symbol state from the state bank to obtain a sequence of preliminary values.

Each of the computation units is allowed to take the preliminary value sequence in accordance with an index difference between the current index associated with the M currently received samples and the previous index associated with the M previously received samples of the same symbol state. Further, each computation unit includes an accumulator, an argument extractor and a scale unit. The accumulator takes a summation of the preliminary value sequence over M' samples with respect to each data symbol in the received sample sequence, and cumulatively adds the summation of the same index difference to yield an accumulative sum that is a complex number. The argument extractor is adapted to obtain the angle of the accumulative sum. The scale unit divides the angle of the accumulative sum by a factor equal to the corresponding index difference to yield a raw frequency offset. As a result, these computation units generate a plurality of raw frequency offsets. Then, the weighting calculator is used to perform a weighted average operation over the raw frequency offsets, and thus a frequency offset estimate for the received sample sequence is obtained.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
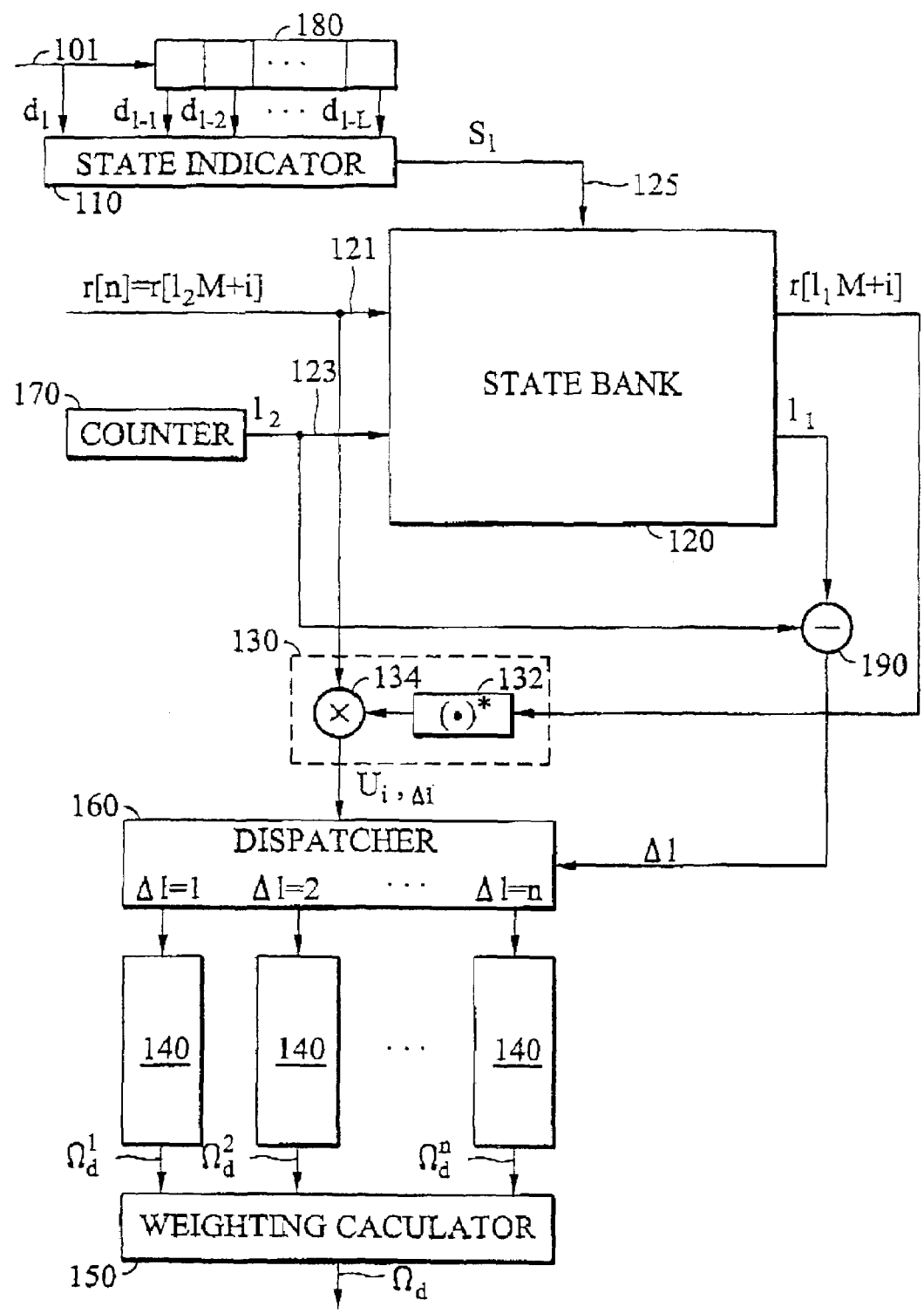
FIG. 1 is a block diagram illustrating a frequency offset estimator according to the invention.

The present invention discloses a so-called state-based differential accumulation (SDA) algorithm for frequency offset estimation. The SDA algorithm of the invention is first introduced and derived mathematically herein. Assuming that the channel is changing sufficiently slowly so it is static over the duration of observation, a continuous-time received signal can be written as $$r(t) = Ae^{j\theta}e^{j\omega_d t}\sum_{k=-\infty}^{\infty} d_k g(t-kT) + w(t)$$

where

A is the channel gain and is a scalar $\theta$ is the phase shift $\omega_d$ is the angular frequency offset $d_k$ is the kth transmitted data symbol g(t) is the equivalent impulse response of transmitter, receiver and channel combination T is the symbol period, and w(t) is the additive complex noise, by sampling r(t) at a rate of M/T, a received sample sequence, r[n], is given by $$r[n] = r\left(n \cdot \frac{T}{M}\right) = Ae^{j\theta}e^{j\omega_d n \frac{T}{M}}\sum_{k=-\infty}^{\infty} d_k g\left(n \cdot \frac{T}{M} - kT\right) + w\left(n \cdot \frac{T}{M}\right)$$

$$= Ae^{j\theta}e^{j\frac{\omega_d T}{M}n}\sum_{k=-\infty}^{\infty} d_k g\left(\frac{T}{M}(n-kM)\right) = w\left(n \cdot \frac{T}{M}\right)$$

$$= Ae^{j\theta}e^{j\frac{\Omega_d}{M}n}\sum_{k=-\infty}^{\infty} d_k g[n-kM] + w[n]$$

where $\Omega_d = \omega_d \cdot T$ is the angular shift over one symbol period $$g[n] = g(t)\bigg|_{t=\frac{nT}{M}}$$

is the discrete-time signal derived from g(t), and $$w[n] = w(t)\bigg|_{t=\frac{nT}{M}}$$

is the discrete-time signal derived from w(t).

In practice, the impulse response is truncated to a finite length equal to L times the symbol period. Without loss of generality, let $g[n]=0, \forall n \notin \{0,1,2,\Lambda,(LM-1)\}$ If $n=l \cdot M+i$ and $i \in \{0,1,2,\Lambda,(M-1)\}$, the received sample sequence becomes $$r[lM+i] = Ae^{j\theta}e^{j\Omega_d(l+\frac{i}{M})}\sum_{k=l-L}^{l} d_k g[(l-k)M+i] + w[n]$$

$$= e^{j\Omega_d(l+\frac{i}{M})} \cdot X(S_l, i) + w[n], l \in Z$$

where $$X(S_l, i) = Ae^{j\theta}\sum_{k=l-L}^{l} d_k g[(l-k)M+i], \text{ and}$$

Z denotes the integer numbers.

The received sample sequence can be associated with a state during each symbol period. The state during the lth symbol is defined as $S_l = \{d_{l-L}, d_{l-L+1}, \Lambda, d_l\}$. It is seen that the state is formed by the current data symbol and the past L data symbols. The ISI-related term, $X(S_l, i)$, depends only on these L+1 data symbols.

The received samples of the same i and the same state are employed to remove the channel effect and to estimate the frequency offset. If the noise term is neglected, then $X(S_{l_1}, i) = X(S_{l_2}, i)$, for any $S_{l_1} = S_{l_2}$ and $l_1 \neq l_2$ After differential operation between $r[l_1M+i]$ and $r[l_2M+i]$, it yields $$u_{i\Delta l} = r[l_2M+i] \cdot r^*[l_1M+i] = e^{j\Omega_d(l_2 l-1)} \cdot |X(S_{l_1}, i)|^2$$

where * superscript denotes complex conjugate operation. The angle of $u_{i\Delta l}$ contains the information of frequency offset. Hence, the angular frequency offset is given by $$\Omega_d = \frac{1}{\Delta l} \angle u_{i\Delta l}$$

where $\Delta l = l_2 - l_1$ is the index difference.

To reduce the variance of a frequency offset estimator, multiple differential operation values are accumulated before taking the phase. For different index differences, accumulations are performed separately since they are not coherent in phase. Hence, the accumulative sum $V(\Delta l)$ of the index difference $\Delta l$ is given by $$V(\Delta l) = \sum \sum_{i=0}^{M-1} u_{i,\Delta l}$$

for the same $\Delta l$

Note that the inner summation, $$\sum_{i=0}^{M-1} u_{i,\Delta l},$$

combines $u_{i\Delta l}$ of the same state over M samples with respect to each data symbol, and the outer summation, $$\sum \sum_{i=0}^{M-1} u_{i,\Delta l},$$

adds the inner summation of the same index difference $\Delta l$ cumulatively. That is, for any two indices spaced with $\Delta l$ and having the same state, the differential operations are performed on their corresponding samples and the resulting values are accumulated in $V(\Delta l)$. The frequency offset estimate derived from each accumulative sum of $\Delta l$ is given by $$\Omega_d^{\Delta l} = \frac{1}{\Delta l} \angle V(\Delta l)$$

Due to the ambiguity from phase wrap-around, the angle of $V(\Delta l)$ ranges between $-\pi$ and $\pi$, and the resolvable range of the estimator is $$|\Omega_d^{\Delta l}| < \frac{\pi}{\Delta l}.$$

This leads to the consideration to avoid using large values of $\Delta l$.

A weighted average can be performed over the frequency offset estimates derived from different values of $\Delta l$:

$$\Omega_d = \frac{1}{\sum_{\Delta l} C(\Delta l)} \sum_{\Delta l} C(\Delta l) \cdot \Omega_d^{\Delta l}$$

where $C(\Delta l)$ represents weighting factors for $\Delta l = 1, 2, \Lambda, \Delta l_{max}$. Also note that the maximum value, $\Delta l_{max}$, is chosen as the above-described consideration. The selection of weighting factors may attempt to minimize the variance of estimation, and it may also take the implementation complexity into account when designing the estimator. In a simplest way, equal weights may be adopted. Alternatively, the weighting factors are proportional to occurrence frequencies of the corresponding $\Delta l$. If the statistics of the data symbol sequence are known and fixed, the weighting factors can be calculated in advance. Otherwise, a set of counters may be adapted to dynamically acquire the number of occurrences for each $\Delta l$. Then the counter values are applied to generate the weighting factors.

There are $$M_d^{L+1}$$

possible states if the size of the set of data symbols is $M_d$. It is desirable to reduce the amount of states. Therefore, it is contemplated that the received sample sequence can be rotated by the conjugate of the data symbol. The noise term is also ignored. Hence, $$r_R[lM+1] = d_l^* \cdot r[lM+i]$$

$$= A e^{j\theta} e^{j\Omega_d(l+\frac{i}{M})} \sum_{k=l-L}^{l} d_l^* d_k g[(l-k)M+i]$$

$$= e^{j\Omega_d(l+\frac{i}{M})} \cdot X(S_{R,l}, i)$$

where $$S_{R,l} = \{d_l^* d_{l-L}, d_l^*, d_{l-L+1}, \Lambda, d_l^* d_l\} = d_l^* \cdot \{d_{l-L}, d_{l-L+1}, \Lambda, d_l\} = d_l^* \cdot S_l$$

It is seen that phase rotation to the received samples causes the same phase rotation to the states. In addition, the state after rotation becomes $$S_{R,l} = \{d_l^* d_{l-L}, d_l^* d_{l-L+1}, \Lambda, d_l^* d_l\} = \{d_l^* d_{l-L}, d_l^* d_{l-L+1}, \Lambda, |d_l|^2\}$$

In the case of phase shift keying (PSK) modulation, the last element in $S_{R,l}$ is a constant, and thus the number of states is reduced to $M_d^L$ by a factor of $M_d$. In a more general way, the rotation phase can also be a mapping function from the data symbol other than its complex conjugate.

As to spread spectrum communications, if the spreading code or spreading waveform is periodic with the same duration as the symbol period, the spreading waveform may be viewed as part of the pulse shaping filter and merged into the equivalent impulse response. Since the scheme of the invention does not require knowledge of the pulse shaping or channel impulse response, the disclosed scheme is also applicable to the spread spectrum communication system.

FIG. 1 illustrates a frequency offset estimator in accordance with the SDA algorithm of the invention. A sequence 101 of data symbols and a sample sequence r[n] are received at a receiver, where n represents the discrete time index. As depicted, the data symbol sequence 101 and the received sample sequence r[n] are sent to a state indicator 110 and state bank 120 of the estimator, respectively. The state indicator 110 generates a state signal indicative of a symbol state and provides the state signal via a line 125 to the state bank 120. The symbol state $S_j$ is defined by a current data symbol, $d_j$, and L most recently received data symbols, $\{d_{j-1}, d_{j-2}, \Lambda, d_{j-L}\}$, where L is the length of the channel delay spread. In FIG. 1, a shift register 180 is provided to keep the L most recently received data symbols from the sequence 101.

Figure 2:
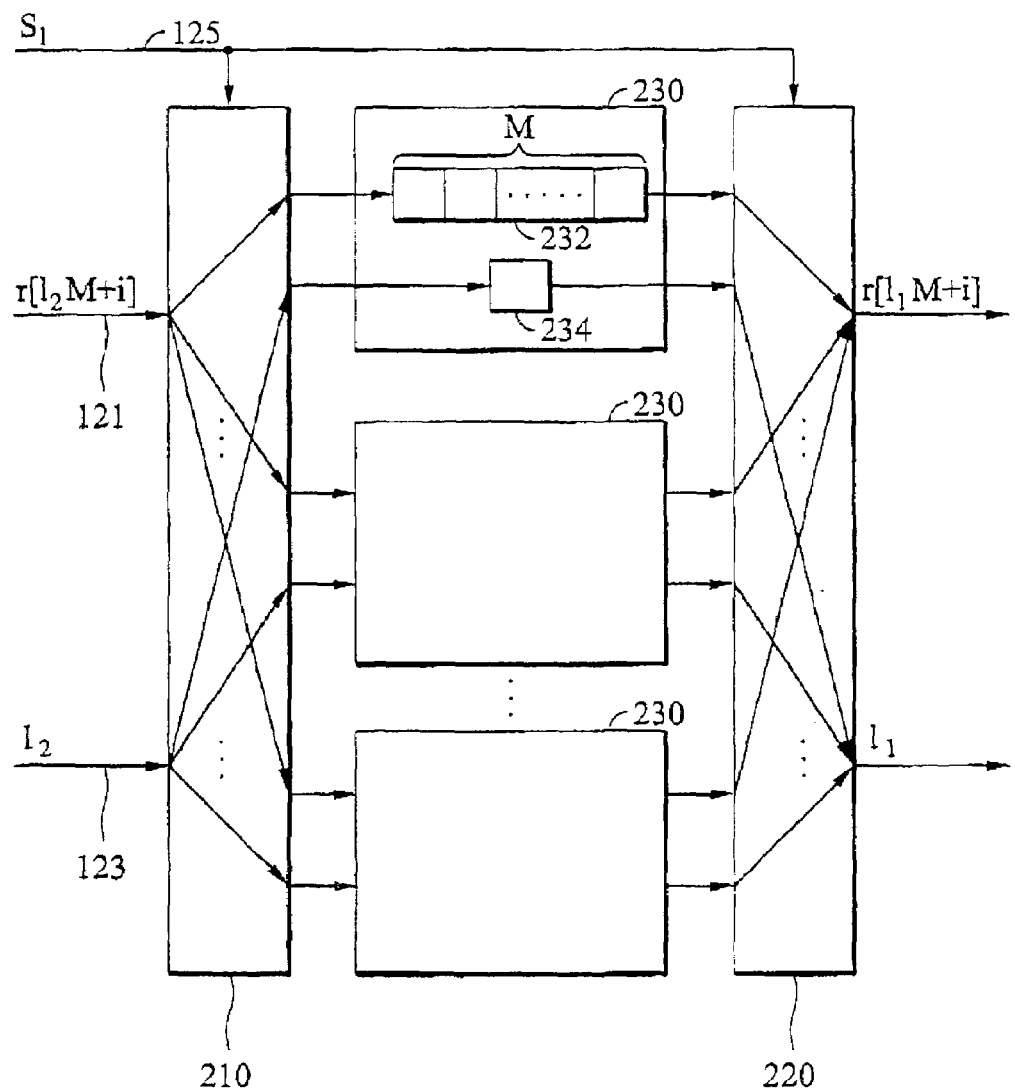
FIG. 2 is a detailed block diagram illustrating a state bank of FIG. 1.
Figure 3:
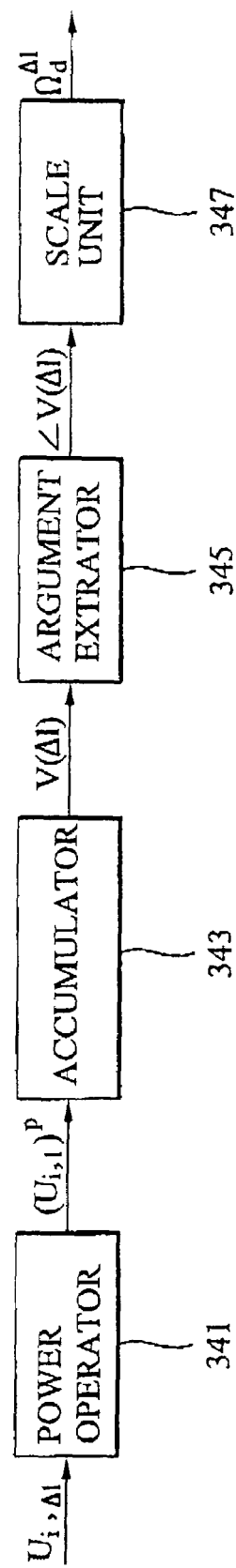
FIG. 3 is a detailed block diagram illustrating a computation unit of FIG. 1.

The estimator of the invention is more clearly described in FIG. 1 taken in conjunction with the detailed block diagrams in FIGS. 2 and 3. The state bank 120 has a first input 121 to take the received sample sequence r[n], a second input 123 to receive a current index $l_2$ associated with the current data symbol $d_j$ and a third input 125 to receive the state signal. Preferably, the current index $l_2$ is generated by a counter 170. From aforementioned discussion, the received sample sequence r[n] can be expressed as r[$l_2$M+i], where M is the number of samples per data symbol in r[n] and i=0,1, . . . , M−1. Referring to FIG. 2, the state bank 120 includes a demultiplexer 210, a multiplexer and N storage areas 230, where N is the number of possible symbol states equal to $M_d^{L+1}$. Each storage area 230 has M elements 232 in which to store and retrieve M samples in the received sample sequence r[n]. In addition, each storage area 230 has an element 234 in which to store and retrieve an associated index. According to the state signal, the demultiplexer 210 dispatches M currently received samples in r[n] and associated current index $l_2$ to one of the storage areas 230 corresponding to the symbol state $S_j$ indicated by the state signal. In the meantime, the multiplexer 220 selects one of the storage areas 230 corresponding to the symbol state $S_j$ according to state signal, such that the selected storage area sends out the M previously received samples of the same symbol state and associated previous index. Thus, depending on the symbol state $S_j$, the state bank 120 retrieves the M previously received samples and associated index, namely r[$l_1$M+i] and $l_1$, as well as updating the corresponding storage area with the M currently received samples of the same state and associated index, namely r[$l_2$M+i] and $l_2$.

A differential unit 130 then performs a differential operation between r[$l_2$M+i] and r[$l_1$M+i] of the same symbol state to yield a sequence of preliminary values as intermediate data. As shown in FIG. 1, the differential unit 130 is made up of conjugate operator 132 and a complex multiplier 134. The conjugate operator 132, on a one-by-one basis, generates the complex conjugate of the M' previously received samples, that is, r*[$l_1$M+i]. The complex multiplier 134 is coupled to the conjugate operator 132. On a similar one-by-one basis, it calculates the product of r[$l_2$M+i] and r*[$l_1$M+i] from $$u_{i,\Delta l}=r[l_2M+i]\cdot r^*[l_1M+i], \text{ for } i=0, 1, \ldots, M'-1$$

where $u_{i,\Delta l}$ represents the preliminary value sequence and M' is a positive integer. On the other hand, the current index $l_2$ and the previous index $l_1$ are applied to a subtractor 190 where an index difference $\Delta l=l_2-l_1$ is obtained. A dispatcher 160 is connected between the differential unit 130 and a plurality of computation units 140, to divert the preliminary value sequence, $u_{i,\Delta l}$, from the differential unit 160 to a corresponding computation units 140 depending on the index difference, $\Delta l$. In this way, each of the computation units 140 is allowed to take $u_{i,\Delta l}$ in accordance with $\Delta l$.

Referring to FIG. 3, each computation unit includes an accumulator 343, an argument extractor 345 and a scale unit 346. The accumulator 343 takes a summation of the preliminary value sequence over M' samples with respect to each data symbol in r[n], and cumulatively adds the summation of the same index difference to yield an accumulative sum. Preferably, a power operator 341 is installed before the accumulator 343 to improve the performance and robustness of the estimator. The power operator 341 calculates a pth power of each preliminary value as follows:

$$(u_{i,\Delta l})=(r[l_2M+i]\cdot r^*[l_1M+i])^p, \text{ for } i=0, 1, \ldots, M'-1$$

where p denotes the power to raise the sequence of preliminary values and equals, but is not limited to, for example, two. Note that $(u_{i,\Delta l})^p$ is a version of the preliminary value sequence $u_{i,\Delta l}$ raised to the pth power. In this regard, the accumulator 343 obtains the accumulative sum by taking double summations $$V(\Delta l) = \sum \sum_{i=0}^{M'-1} (u_{i,\Delta l})^p$$

where an inner summation, $$\sum_{i=0}^{M'-1} (u_{i,\Delta l})^p,$$

combines $(u_{i,\Delta l})^p$ of the same symbol state over M' samples, an outer summation, $$\sum \sum_{i=0}^{M'-1} (u_{i,\Delta l})^p,$$

adds the inner summation of the same $\Delta l$ cumulatively, and $V(\Delta l)$ is the accumulative sum of the index difference $\Delta l$. Note that M' cannot be greater than M, and preferably, M' is equal to M. Subsequently, $V(\Delta l)$ is fed to the argument extractor 345 as the intermediate data. The argument extractor 345 thus obtains the angle of the accumulative sum, namely $\angle V(\Delta l)$. Then, the scale unit 347 divides the angle of the accumulative sum by p and the corresponding index difference as follows:

$$\Omega_d^{\Delta l} = \frac{1}{p\cdot \Delta l}\angle V(\Delta l), \text{ for } -\pi < \angle V(\Delta l) < \pi$$

where $\Omega_d^{\Delta l}$ is a raw offset for the index difference $\Delta l$.

Accordingly, those computation units 140 generate a plurality of raw offsets. A weighting calculator 150 is used to perform a weighted average operation over the raw offsets. It obtains a frequency offset estimate by taking a weighted average over the raw offsets as follows:

$$\Omega_d = \frac{1}{\sum_{\Delta l} C(\Delta l)} \sum_{\Delta l} C(\Delta l) \cdot \Omega_d^{\Delta l}$$

where $\Omega_d$ represents the frequency offset estimate, and $C(\Delta l)$ denotes predetermined weighting factors for all $\Delta l$. Thus, a frequency offset for the received sample sequence is estimated.

Figure 4:
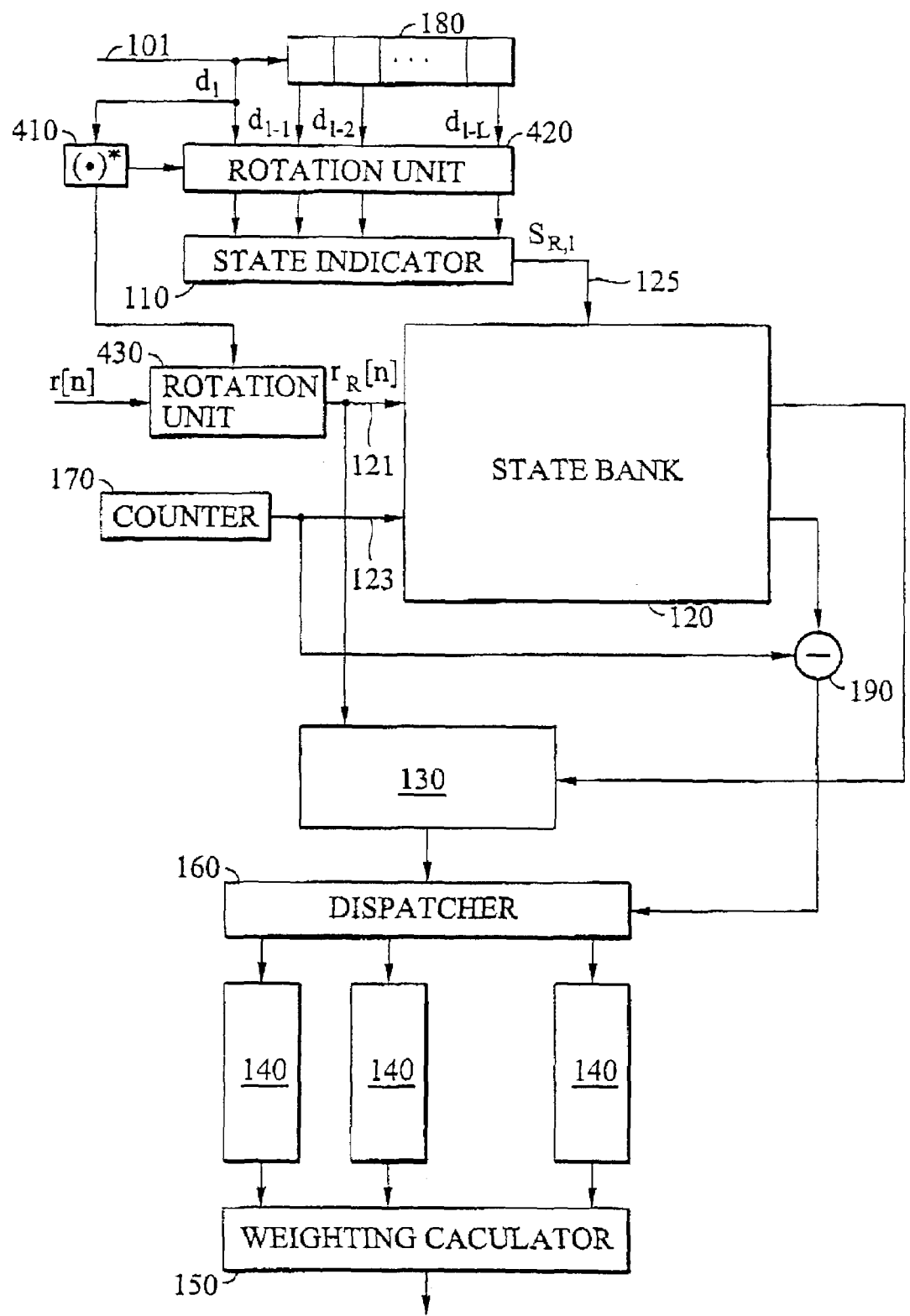
FIG. 4 is a block diagram illustrating a frequency offset estimator with state reduction according to the invention.

Turning now to FIG. 4, a frequency offset estimator with state reduction is illustrated. Note that the same reference numbers identify similar elements in FIGS. 1, 4 and are not discussed herein for brevity. To reduce the number of states, three additional components including two rotation units 420, 430 and a conjugate operator 410 are provided. The conjugate operator 410 yields the conjugate of the current data symbol, i.e. $d_l^*$. The rotation unit 420 is adapted to rotate the phase of the data symbol sequence. The rotated data symbol sequence is then applied to the state indicator 110 to generate the state signal. The rotated data symbol sequence is a version of the data symbol sequence, $\{d_l, d_{l-1}, d_{l-2} \Lambda, d_{l-L}\}$, multiplied by the conjugate of the current data symbol, $d_l^*$. Hence, the symbol state after rotation, $S_{R,l}$ is given by $$S_{R,l} = d_l^* \cdot \{d_l, d_l, d_{l-1}, d_{l-2} \Lambda, d_{l-2}\} = d_l^* \cdot S_l$$

where $S_l$ is the original symbol state. The rotation unit 430 is adapted to rotate the phase of the received sample sequence. The received and rotated sample sequence $r_M[n]$ is a version of the received sample sequence, $r[n]$, multiplied by the conjugate of the current data symbol, $d_l^*$. Hence, $$r_R[n] = r_R[lM+i] = d_l^* \cdot r[lM+i]$$

Then, the received and rotated sample sequence $r_R[n]$ is applied to the first input 121 of the state bank 120. Assuming that the size of the set of data symbols is $M_d$, the number of symbol states is thus reduced from $$M_d^{L+1}$$

to $R_d^L$ by the principles discussed previously.

Figure 5:
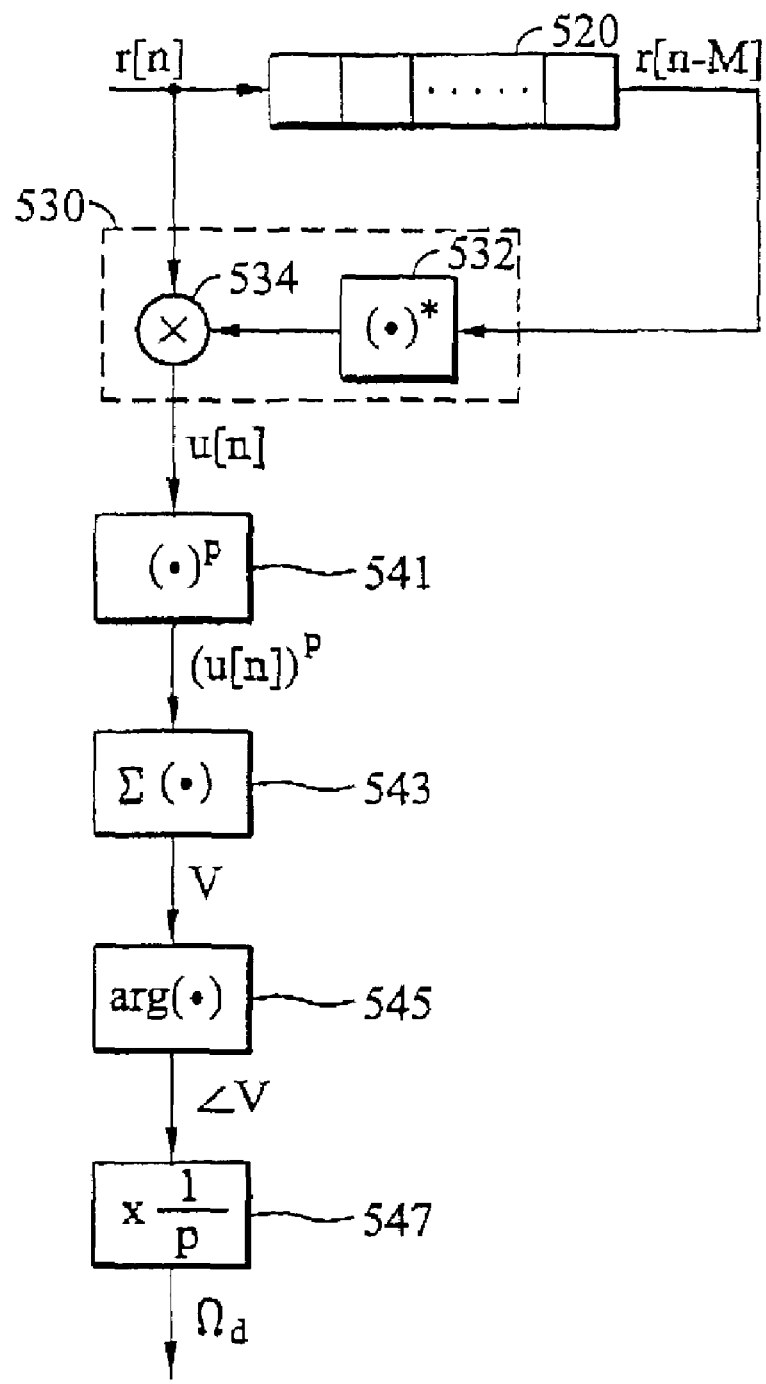
FIG. 5 is a block diagram illustrating an alternative embodiment of the invention.

In a practical communication system, timing information and received data symbols are often unknown when estimating the frequency offset. Therefore, a non-data-aided (NDA) frequency offset estimator is required to perform an initial estimation for ISI channels. Since the received data symbols are unknown, the demultiplexer 210 and multiplexer 220 of the state bank 120 are removed, and only one shift register is left in which to store the received sample sequence. Although the NDA frequency offset estimator is a simplified version of the embodiment in FIG. 1, the aforementioned principles of the invention still hold true. FIG. 5 illustrates a NDA frequency offset estimator of the invention. The estimator includes a storage area 520, a differential unit 530, a power operator 541, an accumulator 543, an argument extractor 545 and a scale unit 547. The storage area 520 contains M elements to take a received sample sequence $r[n]$ serially. Using these M elements, the received sample sequence is shifted by M samples to form a lagged sample sequence, $r[n-M]$. In one embodiment, the storage area 520 is an M-element shift register.

The differential unit 530 performs a differential operation between $r[n]$ and $r[n-M]$ to obtain a sequence of preliminary values $u[n]$ as intermediate data. As depicted, the differential unit 530 is made up of conjugate operator 532 and a complex multiplier 534. The conjugate operator 532 generates the conjugate of the lagged sample sequence, that is, $r^*[n-M]$. The complex multiplier 534 calculates the product of $r[n]$ and $r^*[n-M]$ from $$u[n] = r[n] \cdot r^*[n-M]$$

where n represents the discrete time index. The argument extractor 545 is adapted to obtain the angle of the intermediate data as a frequency offset. Preferably, the power operator 541 is coupled after the differential unit 530, and the accumulator 543 is inserted between the power operator 541 and the argument extractor 545. With the power operator 541, each preliminary value derived from the differential unit 530 is raised to the pth power, i.e., $(u[n])^p$, where p represents the power to raise the preliminary values. Taking p=2 as an example, the power operator 541 calculates the square of each preliminary value, and to yield a sequence of square value as follows:

$$s[n] = (u[n])^2 = (r[n] \cdot r^*[n-M]), \text{ if } p=2.$$

It should be appreciated that the principles of the invention are applicable to $p \geq 2$. The accumulator 543 receives $s[n]$ as input. Hence, an accumulative sum is obtained by taking a summation:

$$V = \sum_{n=0}^{M'-1} s[n]$$

where the accumulative sum, V, is a complex number. In other words, the accumulative sum V combines M' samples with respect to the received sample sequence. Subsequently, V is fed to the argument extractor 345 as the intermediate data. The argument extractor 545 thus obtains the angle of the accumulative sum, namely $\angle V$. After that, the scale unit is used to scale $\angle V$ by a factor of $1/p$ as follows:

$$\Omega_d = \frac{1}{p} \angle V$$

In this way, a frequency offset estimate, $\Omega_d$, is achieved.

Accordingly, the embodiments of the invention enable very simple implementation in integrated circuits due to low computation complexity. Further, the invention provides a novel NDA frequency offset estimator that is robust and well-suited for initial estimation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frequency offset estimation apparatus for intersymbol interference channels, comprising:
   a storage area having M elements to take a received sample sequence serially, for shifting the received sample sequence by M samples to generate a lagged sample sequence, where M is a first positive integer;

a differential unit for performing a differential operation between the received sample sequence and the lagged sample sequence to obtain a sequence of preliminary values as intermediate data;

a power operator coupled after the differential unit, for calculating a pth power of each preliminary value from the differential unit, wherein p denotes the power to raise the sequence of preliminary values and is an integer greater than one;

an argument extractor for obtaining an angle of the intermediate data; and a scale unit coupled after the argument extractor, for scaling the angle of the intermediate data by a factor of 1/p to output as a frequency offset.

2. The frequency offset estimation apparatus according to claim 1, wherein the differential unit comprises:

a conjugate operator for yielding a complex conjugate of the lagged sample sequence; and a complex multiplier for calculating a product of the received sample sequence and the complex conjugate of the lagged sample sequence to output as the preliminary value sequence given by $u[n]=r[n]\cdot r^*[n-M]$ where * superscript denotes complex conjugation, r[n] is the received sample sequence, r*[n−M] is the complex conjugate of the lagged sample sequence, u[n] is the sequence of preliminary values, and n represents a discrete time index.

3. The frequency offset estimation apparatus according to claim 2, wherein the power operator calculates the pth power of each preliminary value from the differential unit as follows:

$(u[n])^p=(r[n]\cdot r^*[n-M])^p$.

4. The frequency offset estimation apparatus according to claim 3 further comprising an accumulator inserted between the power operator and the argument extractor, for taking a summation of $(u[n])^p$ over M' samples to acquire an accumulative sum V as follows:

$$V = \sum_{n=0}^{M'-1} (r[n]\cdot r^*[n-M])^p$$

where M' is a second positive integer, and the accumulative sum V is a complex number and is fed to the argument extractor as the intermediate data.

5. The frequency offset estimation apparatus according to claim 3, wherein p, the power to raise the sequence of preliminary values, is equal to 2.

6. A frequency offset estimation apparatus for intersymbol interference channels, comprising:

a state indicator receiving a sequence of data symbols, for generating a state signal indicative of a symbol state defined by a current data symbol and L most recently received data symbols, where L is a first positive integer;

a state bank having a first input to take a received sample sequence, a second input to receive a current index associated with the current data symbol and a third input to receive the state signal, in accordance with the state signal, for storing the current index from the second input and M currently received samples of the current data symbol from the first input, and retrieving M previously received samples of the same symbol state and an associated previous index, where M is a second positive integer;

a differential unit for performing a differential operation between the M currently received samples in the received sample sequence and the M previously received samples of the same symbol state from the state bank to obtain a sequence of preliminary values as intermediate data;

a plurality of computation units each of which is allowed to take the preliminary value sequence in accordance with an index difference between the current index associated with the M currently received samples and the previous index associated with the M previously received samples of the same symbol state, each computation unit comprising:

an argument extractor for obtaining an angle of the intermediate data as a raw frequency offset; whereby the computation units generate a plurality of raw frequency offsets; and a weighting calculator for performing a weighted average operation over the raw frequency offsets to generate a frequency offset estimate.

7. The frequency offset estimation apparatus according to claim 6, wherein the state bank comprises:

a plurality of storage areas each of which includes a plurality of elements in which to store the M currently received samples in the received sample sequence and the associated current index, and to retrieve the M previously received samples and the associated previous index;

a demultiplexer, in accordance with the state signal, for dispatching the M currently received samples in the received sample sequence and the associated current index to one of the storage areas corresponding to the symbol state indicated by the state signal; and a multiplexer, in accordance with the state signal, for selecting one of the storage areas corresponding to the symbol state indicated by the state signal such that the selected storage area sends out the M previously received samples and the associated previous index, in which the M previously received samples and the M currently received samples are of the same symbol state.

8. The frequency offset estimation apparatus according to claim 6, wherein the differential unit comprises:

a conjugate operator, for yielding complex conjugates of the M' previously received samples in the received sample sequence from the state bank; and a complex multiplier coupled to the conjugate operator, for calculating a product of the M' currently received samples in the received sample sequence and the complex conjugate of each M' previously received samples of the same symbol state to output as the preliminary value sequence which is given by $u_{i\Delta l}=r[l_2 M+i]\cdot r^*[l_1 M+i]$, for $\Delta l=l_2-l_1$ and $i=0, 1, \ldots, M'-1$ where * superscript denotes complex conjugation, M' is a third positive integer less than or equal to M, $\Delta l$ is the index difference, $l_2$ is the current index associated with the M' currently received samples, $l_1$ is the previous index associated with the M' previously received samples of the same symbol state, $r[l_2 M+i]$ represents the M' currently received samples, $r^*[l_1 M+i]$ represents the conjugate of the M' previously received samples of the same symbol state, and $u_{i\Delta l}$ is the preliminary value sequence.

9. The frequency offset estimation apparatus according to claim 8 further comprising a dispatcher inserted between the differential unit and the plurality of computation units, for diverting the preliminary value sequence, $u_{i,\Delta l}$, from the differential unit to a corresponding computation unit in accordance with the index difference, $\Delta l$.

10. The frequency offset estimation apparatus according to claim 8, wherein each of the computation units further comprises a power operator inserted after the differential unit, for calculating a pth power of each preliminary value from the differential unit as follows:

$$(u_{i,\Delta l})^p = (r[l_2 M+i] \cdot r^*[l_1 M+i])^p, \text{ for } i=0, 1, \ldots, M'-1$$

where p denotes the power to raise the sequence of preliminary values and is an integer greater than one, and $(u_{i,\Delta l})^p$ is a version of the preliminary value sequence, $u_{i,\Delta l}$, raised to the pth power.

11. The frequency offset estimation apparatus according to claim 10, wherein each of the computation units further comprises an accumulator inserted between the power operator and the argument extractor, for taking a summation of $(u_{i,\Delta l})^p$ over M' samples with respect to the received sample sequence, cumulatively adding the summation of the same index difference to yield an accumulative sum, and feeding the accumulative sum to the argument extractor as the intermediate data, where the accumulative sum is a complex number.

12. The frequency offset estimation apparatus according to claim 11, wherein each accumulator obtains the accumulative sum by taking double summations:

$$V(\Delta l) = \sum \sum_{i=0}^{M'-1} (u_{i,\Delta l})^p$$

where an inner summation, $$\sum_{i=0}^{M'-1} (u_{i,\Delta l})^p,$$

combines $(u_{i,\Delta l})^p$ of the same symbol state over M' samples with respect to the received sample sequence, an outer summation, $$\sum \sum_{i=0}^{M'-1} (u_{i,\Delta l})^p,$$

adds the inner summation of the same index difference $\Delta l$ cumulatively, and $V(\Delta l)$ is the accumulative sum of the index difference $\Delta l$.

13. The frequency offset estimation apparatus according to claim 12, wherein each of the computation units further comprises a scale unit inserted after the argument extractor, for dividing the angle of the accumulative sum $V(\Delta l)$ by a factor equal to a product of p and the corresponding index difference $\Delta l$ in order to output as the raw frequency offset.

14. The frequency offset estimation apparatus according to claim 13, wherein each scale unit divides the angle of the accumulative sum by p and the corresponding index difference as follows:

$$\Omega_d^{\Delta l} = \frac{1}{p \cdot \Delta l} \angle V(\Delta l), \text{ for } -\pi < \angle V(\Delta l) < \pi$$

where $\angle V(\Delta l)$ denotes the angle of the accumulative sum returned from the argument extractor, and $\Omega_k^{\Delta l}$ is the raw frequency offset for the index difference $\Delta l$.

15. The frequency offset estimation apparatus according to claim 13, wherein the weighting calculator obtains the frequency offset estimate by taking a weighted average over the raw frequency offsets generated from the plurality of computation units as follows:

$$\Omega_d = \frac{1}{\sum_{\Delta l} C(\Delta l)} \sum_{\Delta l} C(\Delta l) \cdot \Omega_d^{\Delta l}$$

where $\Omega_d$ is the frequency offset estimate for the received sample sequence, and $C(\Delta l)$ denotes predetermined weighting factors for all $\Delta l$.

16. The frequency offset estimation apparatus according to claim 6, further comprising a counter for generating the current index associated with the current data symbol in the received sample sequence.

17. The frequency offset estimation apparatus according to claim 6, further comprising:
    means for yielding a conjugate of the current data symbol;
    means for phase rotating the data symbol sequence and applying the rotated data symbol sequence to the state indicator to provide the state signal, in which the rotated data symbol sequence is a version of the data symbol sequence, containing the current data symbol and the L most recently received data symbols, multiplied by the conjugate of the current data symbol; and
    means for phase rotating the received sample sequence and applying the received and rotated sample sequence to the first input of the state bank, in which the received and rotated sample sequence is a version of the received sample sequence multiplied by the conjugate of the current data symbol.

18. The frequency offset estimation apparatus according to claim 10, wherein p, the power to raise the sequence of preliminary values, is equal to 2.

19. A frequency offset estimation apparatus for intersymbol interference channels, comprising:
    a storage area having M elements to take a received sample sequence serially, for shifting the received sample sequence by M samples to generate a lagged sample sequence, where M is a first positive integer;
    means for performing a differential operation between the received sample sequence and the lagged sample sequence to obtain a sequence of preliminary values;
    means for calculating a pth power of the preliminary value sequence, where p denotes the power to raise the sequence of preliminary values and is an integer greater than one;
    means for taking a summation of the power of the preliminary value sequence over M' samples with respect to the received sample sequence to acquire an accumulative sum, where the accumulative sum is a complex number and M' is a second positive integer;
    means for obtaining an angle of the accumulative sum; and means for scaling the angle of the accumulative sum by a factor of 1/p and yielding a frequency offset estimate.

20. The frequency offset estimation apparatus according to claim 19, wherein the differential operation means comprises:
   a conjugate operator for yielding a conjugate of the lagged sample sequence; and
   a complex multiplier for calculating a product of the received sample sequence and the conjugate of the lagged sample sequence to output as the preliminary value sequence which is given by $u[n]=r[n]\cdot r^*[n-M]$, where * superscript denotes complex conjugation, $r[n]$ is the received sample sequence, $r^*[n-M]$ is the conjugate of the lagged sample sequence, $u[n]$ is the sequence of preliminary values, and n represents a discrete time index.

* * * * *